(12) United States Patent
Kim (10) Patent No.: US 9,673,370 B2
(45) Date of Patent: Jun. 6, 2017

(54) WATER-AND-AIR-COOLED THERMOELECTRIC DEVICE

(71) Applicant: Hyundai Motor Company, Seoul (KR)

(72) Inventor: Sang Jun Kim, Hwaseong-si (KR)

(73) Assignee: HYUNDAI MOTOR COMPANY, Seoul (KR)

( * ) Notice: Subject to any disclaimer, the term of this patent is extended or adjusted under 35 U.S.C. 154(b) by 0 days.

(21) Appl. No.: 14/829,263

(22) Filed: Aug. 18, 2015

(65) Prior Publication Data

US 2016/0118567 A1 Apr. 28, 2016

(30) Foreign Application Priority Data

Oct. 24, 2014 (KR) .................. 10-2014-0144670

(51) Int. Cl.
    *H01L 35/30* (2006.01)
(52) U.S. Cl.
    CPC .................... *H01L 35/30* (2013.01)
(58) Field of Classification Search
    None
    See application file for complete search history.

(56) References Cited

U.S. PATENT DOCUMENTS

| 2,928,253 A | * | 3/1960 | Lopp | ...................... F25B 21/02 165/201 |
| 4,829,771 A | * | 5/1989 | Koslow | ................... F25B 21/02 62/3.64 |
| 5,544,487 A | * | 8/1996 | Attey | .................. F04D 13/0673 165/170 |
| 5,564,276 A | * | 10/1996 | Abadilla | ................. F25B 21/04 136/204 |
| 5,584,183 A | * | 12/1996 | Wright | .................... F25B 21/02 165/58 |
| 2001/0018828 A1 | * | 9/2001 | Kadotani | ................ F25B 21/02 62/3.2 |
| 2012/0102974 A1 | * | 5/2012 | Kawazoe | ........... B60H 1/00035 62/3.61 |

FOREIGN PATENT DOCUMENTS

| JP | 2006-136188 A | 5/2006 |
| JP | 2012-180049 A | 9/2012 |
| KR | 10-2008-0039115 A | 5/2008 |

(Continued)

*Primary Examiner* — Eric R Smith
(74) *Attorney, Agent, or Firm* — McDermott Will & Emery LLP (57) ABSTRACT

A water-and-air-cooled thermoelectric device includes water inlet pipes disposed in parallel at an upper side of the thermoelectric device and including a first hot water pipe and a first cool water pipe. Water outlet pipes are disposed in parallel at a lower side of the thermoelectric device and include a second hot water pipe and a second cool water pipe. A plurality of cool water tubes connect the first cool water pipe and the second cool water pipe. Hot water tubes are adjacent to the cool water tubes and connect the first hot water pipe and the second hot water pipe. Thermoelectric elements are disposed between the cool water tubes and the hot water tubes and convert an energy obtained by heat exchange into an electrical energy. A plurality of heat pipes are spaced apart and extend in a direction perpendicular to the hot water tubes.

5 Claims, 5 Drawing Sheets

(56) References Cited

FOREIGN PATENT DOCUMENTS

| KR | 10-2009-0062143 A | 6/2009 |
|---|---|---|
| KR | 10-2009-0089111 A | 8/2009 |
| KR | 10-2010-0031015 A | 3/2010 |
| KR | 10-2011-0080237 A | 7/2011 |
| KR | 2012-0035010 A | 4/2012 |
| KR | 10-1451160 B1 | 10/2014 |

* cited by examiner

FIG. 1

-- Related Art --

WATER-AND-AIR-COOLED THERMOELECTRIC DEVICE

CROSS-REFERENCE TO RELATED APPLICATION

This application claims under 35 U.S.C. §119(a) the benefit of priority to Korean Patent Application No. 10-2014-0144670 filed on Oct. 24, 2014, the entire content of which is incorporated herein by reference.

TECHNICAL FIELD

The present disclosure relates to a thermoelectric device. More particularly, the present disclosure relates to a water-and-air-cooled thermoelectric device capable of simplifying its structure and increasing fuel efficiency and performance.

BACKGROUND

A thermoelectric element includes a thermistor that uses a property of a semiconductor in which electric resistance is greatly changed by a very small change in temperature and uses a change in temperature caused by electric resistance. A thermoelectric element uses the Seebeck effect, which is a phenomenon in which electromotive force is generated by a difference in temperature between two different metallic joint portions and in which electromotive force (force which generates an electric potential difference between two points and allows an electric current to flow) is generated by a difference in temperature. A Peltier element uses a Peltier effect which is a phenomenon in which heat is absorbed or generated by an electric current.

The thermistor is a semiconductor element in which the electric resistance greatly changes by the change in temperature. The thermistor element includes a negative temperature coefficient (NTC) thermistor in which electric resistance is greatly decreased by an increase in temperature and a PTC thermistor in which resistance is increased by an increase in temperature. The thermistor is manufactured by mixing a plurality of components of oxides that include molybdenum, nickel, cobalt, iron, and the like and by sintering the mixture, and is used to stabilize a circuit and to detect heat, electric power, light, and the like.

In the Seebeck effect, electromotive force is generated when both ends of two different metals are joined together and temperatures at both ends become different from each other, and the Seebeck effect is applied to measure a temperature using a thermocouple.

The Peltier effect, which is used for electronic cooling, refers to a phenomenon in which when ends of two different of metals are joined together and an electric current flows through the ends, one end absorbs heat and another other end generates heat in accordance with a direction of the electric current. When semiconductors such has bismuth, tellurium, and the like having different electrical conductivity are used instead of the two different of metals, the Peltier element may efficiently absorb and generate heat.

The heat absorbing and generating operation of the Peltier element may vary in accordance with a direction of an electric current, and the amount of absorbed heat and the amount of generated heat may be adjusted by the amount of electric currents. Therefore, the Peltier element is mainly used to manufacture a refrigerator with a small capacity or a precise thermostat that is used at about room temperature.

A heat radiating part of a thermoelectric element needs to be efficiently cooled to improve cooling performance according to the heat absorbing and generating operation and thus to improve cooling performance of the opposite heat absorbing part.

However, in the existing system for cooling the heat radiating part of the thermoelectric element is directly disposed on a ceramic plate of a module, and thus is not efficient because the system adopts only one of a water cooling function and an air cooling function.

Therefore, it is required to provide a thermoelectric element system which increases an area of the heat radiating part and which improves cooling efficiency by using a water cooling function and an air cooling function at the same time.

Figure 1:
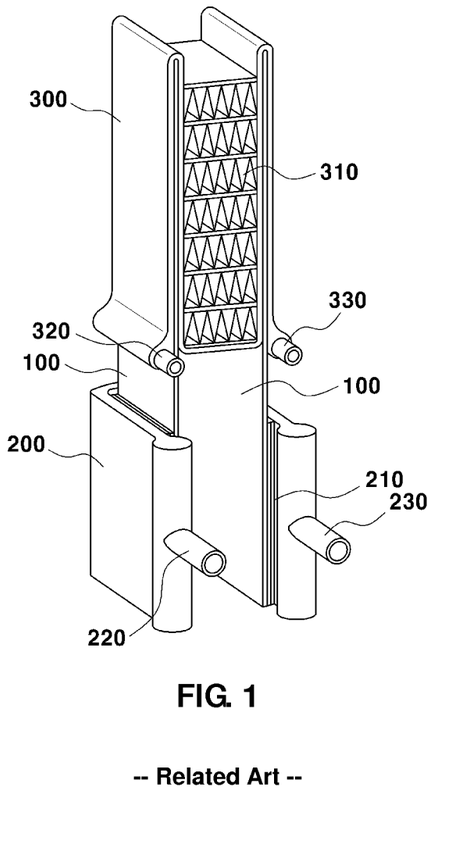
FIG. 1 is a configuration view of a thermoelectric device in the related art into which a water cooling function and an air cooling function are incorporated.
Figure 2:
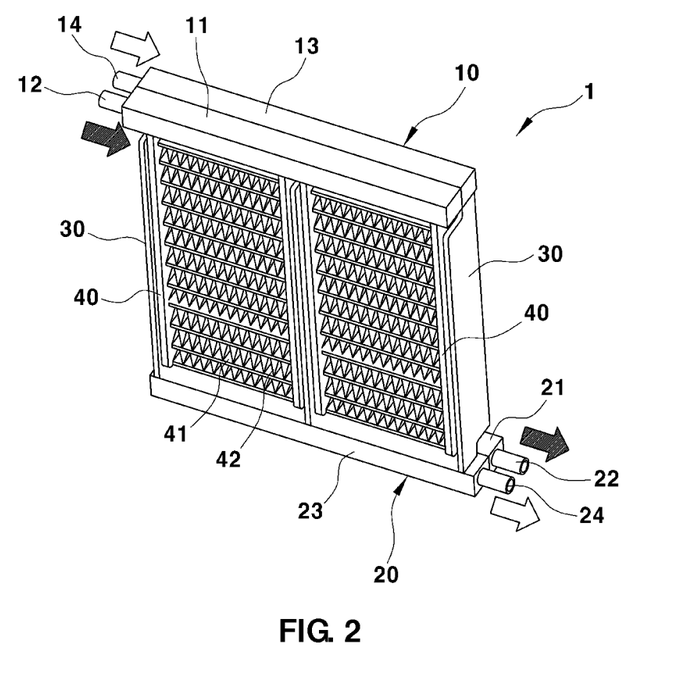
FIG. 2 is a configuration view of a thermoelectric device according to the present disclosure, into which a water cooling function and an air cooling function are incorporated.
Figure 3:
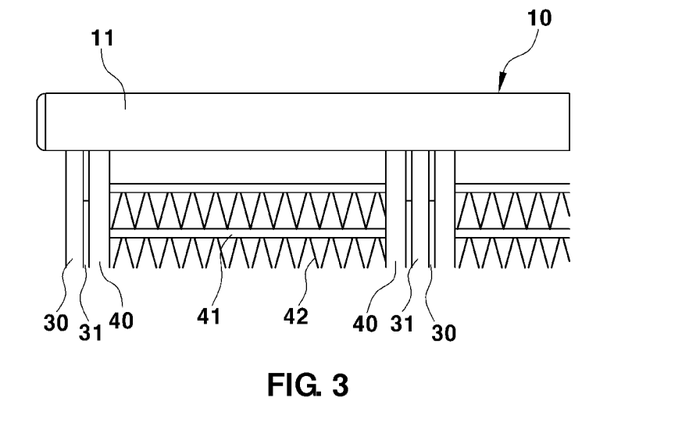
FIG. 3 is an enlarged configuration view illustrating a main part of the thermoelectric device according to the present disclosure, into which a water cooling function and an air cooling function are incorporated.

In order to satisfy the aforementioned requirement, a water cooling type and air cooling thermoelement system has been proposed. Referring to FIG. 1, a thermoelectric element system of the related art improves cooling performance by changing a shape of a cooling tube. The thermoelectric element system according to the related art comprises cooling fins 310, thereby performing a cooling operation in an air-cooled manner as well as in a water-cooled manner. A thermoelectric device, into which a water cooling function and an air cooling function are incorporated, includes a heat absorbing part cooling tube 200 to which a thermoelectric element module 210 is attached. The heat absorbing part cooling tube 200 has a U shape so as to surround lower portions of heat transfer pipes 100 having two flat surfaces that face each other for heat conduction. A heat radiating part cooling tube 300 is formed to surround upper portions of the heat transfer pipes 100 and has the cooling fins 310 mounted therebetween. According to the related art, a cooling area may be increased, cooling efficiency is improved, and a cooling operation in an air-cooled manner is performed by using the cooled air from a radiator.

However, in the related art, since heat from a heat radiating part is transferred from a heat pipe to the cooling tube 300, the heat is generated at the cooling tube 300. Since the heat is transferred to the cooling tube 300 while repeatedly performing the heat exchange, a thermal loss occurs. A temperature of the heat radiating part decreases further, thus greatly degrading thermal efficiency. Further, the cooling tube 300 combined with the heat pipe of the heat radiating part has a complicated shape, and as a result, flow resistance occurs.

The thermoelectric device may be configured as a single module for a small-sized vehicle. However, a commercial vehicle requires a thermoelectric device having a large capacity, and thus, there is a great disadvantage in coupling the modules.

The above information disclosed in this Background section is only for enhancement of understanding of the background of the disclosure, and therefore, it may contain information that does not form the prior art that is already known in this country to a person of ordinary skill in the art.

SUMMARY OF THE DISCLOSURE

The present disclosure has been made in an effort to solve the above-described problems associated with prior art and to provide a thermoelectric device into which a water cooling function and an air cooling function are incorporated, which may be optimized in terms of efficiency and performance, and may be increased in capacity, by simplifying a structure of the thermoelectric device and improving assembly performance, in comparison with the related art.

According to an exemplary embodiment of the present inventive concept, a water-and-air-cooled thermoelectric device includes water inlet pipes disposed in parallel at an upper side of the thermoelectric device. The water inlet pipes include a first hot water pipe having a hot water inlet at one side thereof and a first cool water pipe having a cool water inlet at one side thereof. Water outlet pipes are disposed in parallel at a lower side of the thermoelectric device and correspond to the water inlet pipes. The water outlet pipes include a second hot water pipe having a hot water outlet at one side thereof and a second cool water pipe having a cool water outlet at one side thereof. A plurality of cool water tubes connect the first cool water pipe and the second cool water pipe and are spaced apart continuously at an interval in a longitudinal direction. A plurality of hot water tubes are adjacent to the cool water tubes and connect the first hot water pipe and the second hot water pipe. A plurality of thermoelectric elements are disposed between the cool water tubes and the hot water tubes while being in surface-to-surface contact with the cool water tubes and the hot water tubes. The thermoelectric elements convert an energy obtained by the heat exchange into an electrical energy. A plurality of heat pipes are spaced apart at an interval in the longitudinal direction at one side of the hot water tubes and extend in a direction perpendicular to the hot water tubes.

According to the present disclosure, in comparison with the thermoelectric device of the related art, it is possible to greatly increase a heat radiating area, minimize a thermal loss by optimizing the structure, and maximize capability and efficiency to radiate heat.

Further, it is possible to configure the thermoelectric device in accordance with a required capacity when the thermoelectric device with a large capacity is required.

Other aspects and exemplary embodiments of the invention are discussed infra.

BRIEF DESCRIPTION OF THE DRAWINGS

The above and other features of the present disclosure will now be described in detail with reference to exemplary embodiments thereof illustrated in the accompanying drawings which are given hereinbelow by way of illustration only, and thus are not limitative of the present disclosure.

It should be understood that the appended drawings are not necessarily to scale, presenting a somewhat simplified representation of various features illustrative of the basic principles of the disclosure. The specific design features of the present invention as disclosed herein, including, for example, specific dimensions, orientations, locations, and shapes will be determined in part by the particular intended application and use environment.

In the figures, reference numbers refer to the same or equivalent parts of the present disclosure throughout the several figures of the drawing.

DETAILED DESCRIPTION

Hereinafter, reference will now be made in detail to various embodiments of the present inventive concept, examples of which are illustrated in the accompanying drawings and described below. While the disclosure will be described in conjunction with exemplary embodiments, it will be understood that the present description is not intended to limit the disclosure to those exemplary embodiments. On the contrary, the disclosure is intended to cover not only the exemplary embodiments, but also various alternatives, modifications, equivalents, and other embodiments, which may be included within the spirit and scope of the disclosure as defined by the appended claims.

It is understood that the term "vehicle" or "vehicular" or other similar terms as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, plug-in hybrid electric vehicles, hydrogen-powered vehicles and other alternative fuel vehicles (e.g., fuel derived from resources other than petroleum). As referred to herein, a hybrid vehicle is a vehicle that has two or more sources of power, for example both gasoline-powered and electric-powered vehicles.

Hereinafter, an exemplary embodiment of the present inventive concept will be described in detail with reference to the accompanying drawings so that those with ordinary skill in the art to which the present disclosure pertains may easily carry out the exemplary embodiment.

As illustrated in FIGS. 2 to 5, a water-and-air-cooled thermoelectric device of the present disclosure comprises water inlet pipes 10 which include a first hot water pipe 11 and a first cool water pipe 13 having a hot water inlet 12 and a cool water inlet 14 at one side thereof, respectively, and are disposed in parallel at an upper side of the thermoelectric device. Water outlet pipes 20 correspond to the water inlet pipes 10, include a second hot water pipe 21 and a second cool water pipe 23 having a hot water outlet 22 and a cool water outlet 24 at one side thereof, respectively, and are disposed in parallel at a lower side of the thermoelectric device.

A plurality of cool water tubes 30, which are spaced apart at intervals continuously in a longitudinal direction and connect the first cool water pipe 13 and the second cool water pipe 23, are disposed between the water inlet pipes 10 and the water outlet pipes 20.

The first hot water pipe 11 and the second hot water pipe 21 are connected with each other by hot water tubes 40 at locations adjacent to the cool water tubes 30. Thermoelectric elements 31, which convert energy obtained by heat exchange into electrical energy, are disposed between the cool water tubes 30 and the hot water tubes 40 while being in surface-to-surface contact with the cool water tubes 30 and the hot water tubes 40. The thermoelectric device further includes a plurality of heat pipes 41 spaced apart at intervals in the longitudinal direction at one side of the hot water tubes 40 and extending in a direction perpendicular to the hot water tubes 40.

Here, in order to effectively cool heat radiating portion, which is critical in improving performance for cooling the thermoelectric elements 31, both water and air are used in radiating heat.

The present disclosure improves efficiency and performance of the thermoelectric device by further simplifying and optimizing the structure of the thermoelectric device compared to the existing thermoelectric device, in which the thermoelectric device can be easily and structurally modified when a capacity of the thermoelectric device is increased.

That is, the thermoelectric elements 31 are disposed between the cool water tubes 30 and the hot water tubes 40, thereby cooling a radiator 2 by heat exchange between the water and heat transferred by conduction.

In addition, a circulating fluid is transferred to cooling fins 42 through the heat pipes 41 connected to the hot water tubes 40 for a dual cooling effect by using air that comes into contact with the cooling fins 42.

Therefore, paths through which heat is transferred to the thermoelectric elements 31 are minimized, thereby minimizing a thermal loss that occurs at each path. Further, resistance, which occurs when the fluid circulates, may be further reduced by simplifying shapes of the hot water tubes 40 and the cool water tubes 30.

Figure 4:
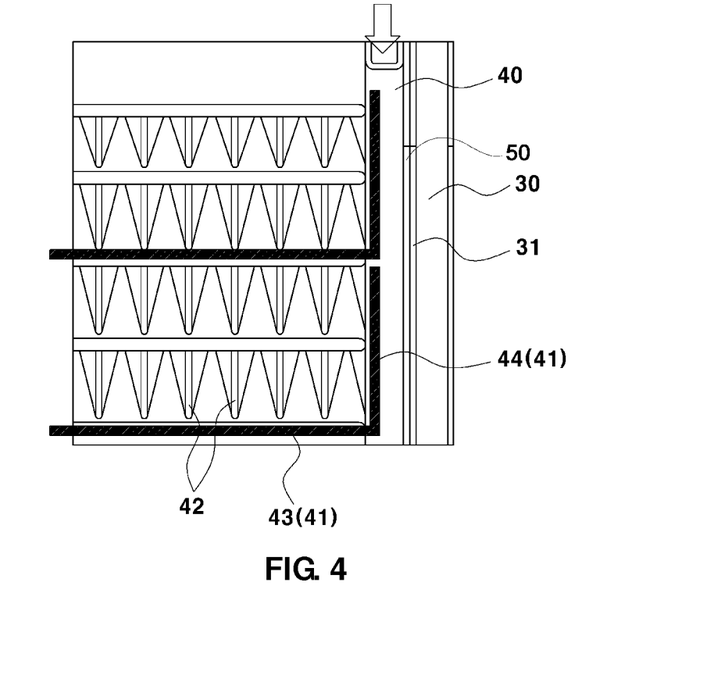
FIG. 4 is an enlarged configuration view illustrating another main part of the thermoelectric device according to the present disclosure, into which a water cooling function and an air cooling function are incorporated.

Referring to FIG. 4, a plurality of heat radiating fins 42, which may perform an air cooling function while being in contact with external air, may be formed on one surface or both surfaces of the heat pipes 41 and may protrude in the longitudinal direction.

Figure 5:
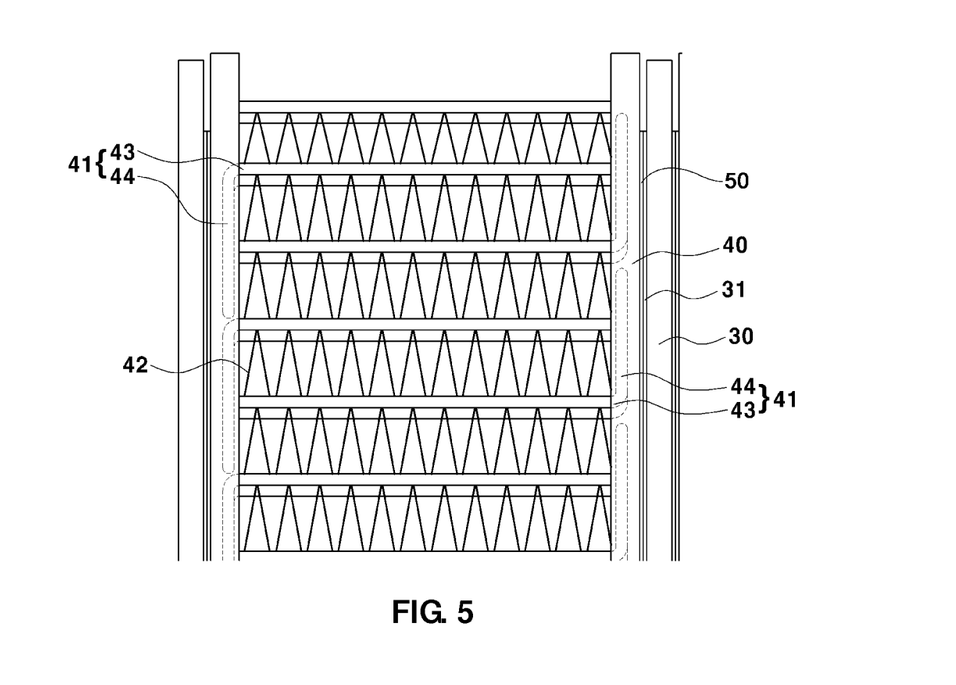
FIG. 5 is a configuration view illustrating an assembled state of the thermoelectric device according to the present disclosure, into which a water cooling function and an air cooling function are incorporated.

Referring to FIG. 5, the heat pipes 41 may include heat radiating parts 43 which extend in a direction perpendicular to the hot water tubes 40 and radiate heat while being in contact with external air. Heat absorbing parts 44 are bent from end portions of the heat radiating parts 43 in a direction perpendicular to the heat radiating parts 43 and extend in the longitudinal direction of the hot water tubes 40 so as to transfer the heat from the hot water tubes 40 to the heat radiating parts 43. The heat radiating parts 43 and the heat absorbing parts 44 may be integrally formed.

Here, while the heat radiating parts 43 of the heat pipes 41 are exposed to outside to be in contact with the external air, the heat absorbing parts 44 are inserted into the hot water tubes 40, thereby minimizing a thermal loss.

Therefore, the heat radiating parts 43 and the heat absorbing parts 44 are integrally formed by bending the heat pipes 41 to have an 'L' shape, and the heat pipes 41 is fixed by inserting the heat absorbing parts 44 into the hot water tubes 40 for a complete connection.

Heat-resistant ceramic plates 50 may be further provided between the thermoelectric elements 31 and the hot water tubes 40.

In comparison with the existing heat pipe that is attached by welding, the heat pipes 41 of the present disclosure are mounted inside the hot water tubes 40, thereby reducing heat transfer processes. Accordingly, heat is absorbed using a fluid, thereby increasing an area for absorbing heat from the heat pipe 41 and absorbing heat at a uniform temperature.

Figure 6:
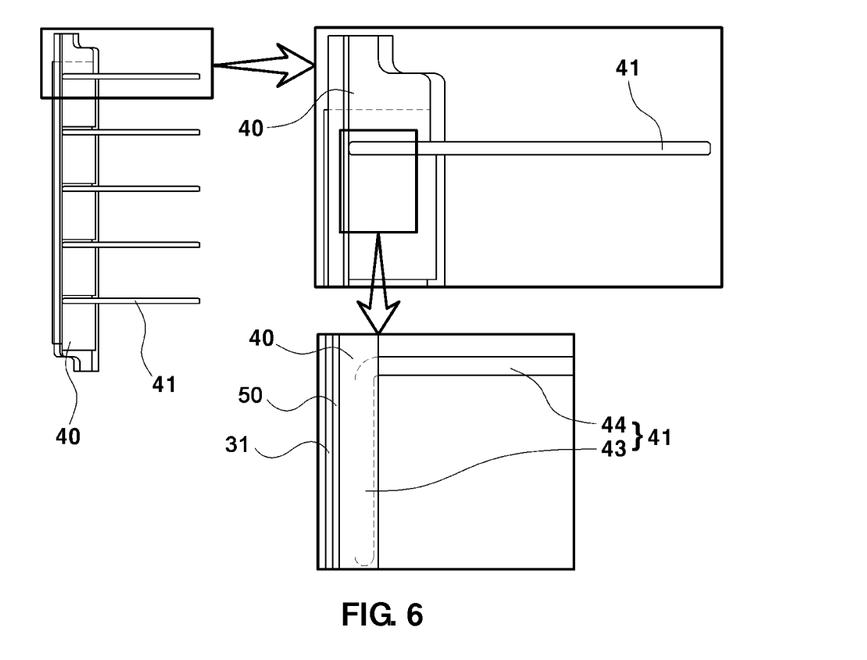
FIG. 6 is an enlarged configuration view illustrating a state in which a heat pipe is coupled to the thermoelectric device according to the present disclosure, into which a water cooling function and an air cooling function are incorporated.

Referring to FIG. 6, the hot water tubes 40, which connect the first and second hot water pipes 11, 21, and the heat pipes 41, which extend from the hot water tubes 40, may be configured as a unit block so that the hot water tubes 40 and the heat pipes 41 may be connected continuously in accordance with a required capacity.

Therefore, when two hot water tubes 40 are rotated by 180 degrees in a state in which two hot water tubes 40 face each other, a position of the cooling fin 42 is identical to a position of the heat pipe 41, thereby facilitating expandability.

That is, a hot water tube 40 at a left side and a hot water tube 40 at a right side are the same product which may be sequentially assembled in order to increase a capacity of a system.

Two cool water tubes 30 may be joined and used between the thermoelectric elements 31 as necessary. Alternatively, one cool water tube 30 may be eliminated so that two thermoelectric elements 31 cool the single cool water tube 30.

Figure 7:
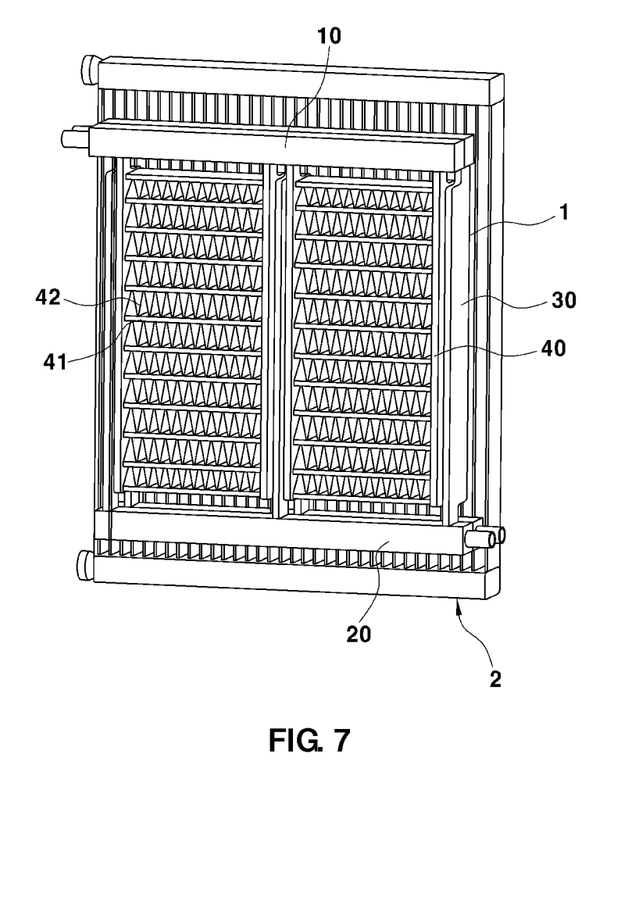
FIG. 7 is a view illustrating an installed state of the thermoelectric device according to the present disclosure, into which a water cooling function and an air cooling function are incorporated.

As illustrated in FIG. 7, since the water-and-air-cooled thermoelectric device 1 of the present disclosure is mounted on the existing engine radiator 2, it is not necessary to install a separate fan, thereby significantly improving energy efficiency.

By providing the present disclosure as described above, it is possible to greatly increase a heat radiating area, minimize a thermal loss by optimizing the structure, maximize capability and efficiency to radiate heat, and freely increase the number of thermoelectric devices so as to build up the thermoelectric device with a large capacity when the thermoelectric device with a large capacity is required.

The disclosure has been described in detail with reference to exemplary embodiments thereof. However, it will be appreciated by those skilled in the art that changes may be made in these embodiments without departing from the principles and spirit of the disclosure, the scope of which is defined in the appended claims and their equivalents.

What is claimed is:

1. A water-and-air-cooled thermoelectric device comprising:
    a plurality of water inlet pipes disposed in parallel at an upper side of the thermoelectric device, the water inlet pipes including a first hot water pipe that has a hot water inlet at one side thereof and a first cool water pipe that has a cool water inlet at one side thereof;
    a plurality of water outlet pipes disposed in parallel at a lower side of the thermoelectric device and corresponding to the water inlet pipes, the water outlet pipes including a second hot water pipe that has a hot water outlet at one side thereof and a second cool water pipe that has a cool water outlet at one side thereof;
    a plurality of cool water tubes connecting the first cool water pipe and the second cool water pipe and spaced apart continuously at an interval in a left-right direction;
    a plurality of hot water tubes adjacent to the cool water tubes and spaced apart continuously at an interval in the left-right direction, and connecting the first hot water pipe and the second hot water pipe;
    a plurality of thermoelectric elements disposed between the cool water tubes and the hot water tubes and the thermoelectric elements converting an energy which is obtained by a heat exchange into electrical energy;
    a plurality of heat pipes spaced apart at an interval in an up-down direction between the plurality of the hot water tubes and extending perpendicular to the hot water tubes at one side of the hot water tubes; and heat-resistant ceramic plates disposed between the thermoelectric elements and the hot water tubes,
wherein the thermoelectric elements are in surface-to-surface contact with the cool water tubes and the heat-resistant ceramic plates.

2. The water-and-air-cooled thermoelectric device of claim 1, wherein the plurality of heat pipes include a plurality of heat radiating fins, which perform an air cooling function while being in contact with external air, protruding in the up-down direction on one surface or both surfaces of the heat pipes.

3. The water-and-air-cooled thermoelectric device of claim 1, wherein the plurality of heat pipes include:
   heat radiating parts extending in a direction perpendicular to the hot water tubes and radiating heat while being in contact with external air; and
   heat absorbing parts bending from ends of the heat radiating parts in a direction perpendicular to the heat radiating parts and extending along a longitudinal direction of the hot water tubes to transfer heat from the hot water tubes to the heat radiating parts,
   wherein the heat radiating parts and the corresponding heat absorbing parts are integrally formed as one unit.

4. The water-and-air-cooled thermoelectric device of claim 3, wherein the heat radiating parts are exposed to outside to be in contact with the external air, and the heat absorbing parts are inserted into the hot water tubes.

5. The water-and-air-cooled thermoelectric device of claim 1, wherein the hot water tubes, which connect the first and second hot water pipes, and the heat pipes, which extend from the hot water tubes, are integrally formed as a unit block so that the hot water tubes and the heat pipes are connected continuously in accordance with a required capacity.

* * * * *